United States Patent [19]
Hasemi et al.

[11] Patent Number: 5,567,574
[45] Date of Patent: Oct. 22, 1996

[54] REMOVING AGENT COMPOSITION FOR PHOTORESIST AND METHOD OF REMOVING

[75] Inventors: Ryuji Hasemi; Keiichi Iwata; Mayumi Hada; Hidetoshi Ikeda, all of Niigata, Japan

[73] Assignee: Mitsubishi Gas Chemical Company, Inc., Tokyo, Japan

[21] Appl. No.: 569,673

[22] Filed: Dec. 8, 1995

[30] Foreign Application Priority Data

Jan. 10, 1995 [JP] Japan .................................. 7-002077
Mar. 28, 1995 [JP] Japan .................................. 7-069746

[51] Int. Cl.$^6$ .............................. G03F 7/30; C11D 3/43
[52] U.S. Cl. ............................ 430/331; 134/38; 134/39; 134/40; 134/41; 156/659.1; 510/176
[58] Field of Search ........................ 430/331; 252/153, 252/158, 170, 171, 172, 174.17, DIG. 8

[56] References Cited

U.S. PATENT DOCUMENTS

| | | | |
|---|---|---|---|
| 4,744,834 | 5/1988 | Hag ................................ | 430/331 |
| 5,185,235 | 2/1993 | Sato et al. ......................... | 430/331 |
| 5,279,771 | 1/1994 | Lee ................................ | 430/331 |

OTHER PUBLICATIONS

H. Tomihari et al, "Solvent compositions for removing protective films from automobile bodies", Chemical Abstracts, vol. 117, No. 8, 24 Aug. 1992, Columbus, Ohio, abstract No. 71841 of JP-A-04 080 271 (Yushiro Kagaku Kogyo K.K.) 13 Mar. 1992.

Patent Abstracts Of Japan, vol. 011, No. 236 (P-601), 4 Aug. 1987 of JP-A-62 049355 (Nagase Sangyo KK), 4 Mar. 1987.

Patent Abstracts Of Japan, vol. 013, No. 239 (P-879), 6 Jun. 1989 of JP-A-01 042653 (Tokyo Ohka Kogyo Co. Ltd) 14 Feb. 1989.

Primary Examiner—Hoa Van Le
Attorney, Agent, or Firm—Frishauf, Holtz, Goodman, Langer & Chick, P.C.

[57] ABSTRACT

A removing agent composition for a photoresist is disclosed which comprises 5 to 50% by weight of an alkanolamine, an alkoxyalkylamine or an alkoxyalkanolamine, 1 to 30% by weight of a glycol monoalkyl ether, 0.5 to 15% by weight of a sugar or a sugaralcohol, 0.01 to 10% by weight of a quaternary ammonium hydroxide, if necessary, and water as the balance; and a method of removing by the use of this composition is also disclosed herein.

According to the present invention, there can be provided the removing agent composition for the photoresist which can easily remove, at a low temperature in a short time, a photoresist film applied onto an inorganic substrate in a manufacturing process of semiconductor integrated patterns, a remaining photoresist layer after dry etching or a remaining photoresist residue after ashing and which does not corrode a wiring material at all and which can be rinsed with water alone.

10 Claims, 1 Drawing Sheet

REMOVING AGENT COMPOSITION FOR PHOTORESIST AND METHOD OF REMOVING

BACKGROUND OF THE INVENTION

1. Field of the Invention

The present invention relates to a removing and cleaning agent (hereinafter referred to simply as "removing agent") composition for a photoresist and a method of remove, and more specifically, it relates to a removing agent composition for removing photoresist layers in the manufacturing process of semiconductor integrated patterns, and a method for removing the photoresist layers.

2. Description of the Related Arts

Each semiconductor integrated pattern can be manufactured by a method which comprises applying a photoresist onto an inorganic substrate, carrying out exposure and development to form a photoresist pattern, etching the unmasked portions of the inorganic substrate through the photoresist pattern as a mask to form a fine pattern, and then releasing the photoresist film from the inorganic substrate, or by a method which comprises carrying out ashing after the formation of the fine pattern in the same manner, and then releasing a remaining resist residue from the inorganic substrate.

Heretofore, as the removing liquid for the photoresist which can be used in these methods, acidic removing agents and alkaline removing agents have usually been used.

Examples of the acidic removing agents include a removing agent comprising an arylsulfonic acid such as benzenesulfonic acid, toluenesulfonic acid or xylenesulfonic acid, a phenol and a chlorine-containing organic solvent (U.S. Pat. No. 3,582,401), and a removing agent comprising an aromatic hydrocarbon such as naphthalene, a phenol and an arylsulfonic acid (Japanese Patent Application Laid-open No. 35357/1987).

These acidic removing agents are weak in releasing force, and what is worse, they are strongly corrosive to aluminum, copper and the like which have often been used as wiring materials for the formation of fine wires. For this reason, they are not suitable for fine works in which dimensional accuracy has been severe in recent years. Furthermore, the solubility of these acidic removing liquids in water is low, so that after the removing of the photoresist, rinsing is required to be done with an organic solvent such as an alcohol prior to water washing, which makes the process intricate.

On the other hand, examples of the alkaline removing liquids include a removing agent comprising an ethylene oxide adduct of an alkanolamine or a polyalkylene polyamine, a sulfone compound and a glycol monoalkyl ether (Japanese Patent Application Laid-open No. 49355/1987) and a removing agent comprising dimethyl sulfoxide as a main component, a diethylene glycol monoalkyl ether and a nitrogen-containing organic hydroxy compound (Japanese Patent Application Laid-open No. 42653/1989).

However, each of the above-mentioned alkaline removing agents dissociates by moisture absorbed during use to generate an amine which assumes alkalinity. Thus, if water washing is carried out after the removing of a photoresist without washing with an organic solvent such as an alcohol, the alkalinity is assumed at the time of the water washing. In addition, the alkaline removing agent has a strongly corrosive function to aluminum, copper and the like which have often been used as wiring materials for the formation of fine pattern, and therefore, the alkaline removing agent is not suitable for the work of ultrafine pattern in which dimensional accuracy has been strict in recent years. Moreover, when the alkaline removing agent is used, the rinsing with an organic solvent such as an alcohol is necessary after the removing of the photoresist. Accordingly, the alkaline removing agent has a problem that a process is intricate, as in the case of the acidic removing liquid.

In recent years, the etching conditions of the wiring material are more and more strict with a tendency that a wiring process becomes ultrafine, so that the used photoresist tends to bring about the change in quality. Hence, the releasing properties of the above-mentioned acidic removing liquid and alkaline removing liquid are insufficient, with the result that there is a problem that the photoresist remains on the inorganic substrate inconveniently.

Therefore, in order to prevent the above-mentioned problems, a removing agent is required which can easily remove a resist film, a resist layer, a resist residue and the like and which does not corrode a wiring material at the resist removing.

SUMMARY OF THE INVENTION

An object of the present invention is to provide a removing agent composition for a photoresist which can solve the above-mentioned problems of removing agents regarding conventional techniques, can easily remove, at a low temperature in a short time, a photoresist film applied onto an inorganic substrate, a remaining photoresist layer after the dry etching of the photoresist film applied onto the inorganic substrate, or a remaining photoresist residue after the dry etching and ashing, permits an ultrafine work without corroding any wiring material at the releasing operation, can be rinsed with water alone without requiring the use of an organic solvent such as an alcohol as a rinsing agent, and enables the manufacture of highly accurately wired patterns.

The present inventors have intensively investigated to solve the above-mentioned problems, and as a result, it has been found that a removing agent composition comprising an aqueous solution containing an alkanolamine, an alkoxyalkylamine or an alkoxyalkanolamine, a glycol monoalkyl ether and a sugar or a sugaralcohol can easily remove a photoresist at a low temperature in a short period of time in a manufacturing process of semiconductor integrated patterns and has excellent characteristics such as non-corrosible properties by virtue of which a wiring material is not corroded at all and the simplicity/easiness of a removing operation. In consequence, the present invention has been attained.

Furthermore, the present inventors have also found that a removing agent composition comprising an aqueous solution containing an alkanolamine, an alkoxyalkylamine or an alkoxyalkanolamine, a glycol monoalkyl ether, a sugar or a sugaralcohol and a quaternary ammonium hydroxide can also solve the above-mentioned problems, and in consequence, the present invention has been attained.

That is to say, the first aspect of the present invention is directed to a removing agent composition for a photoresist which comprises (1) 5 to 50% by weight of an alkanolamine, an alkoxyalkylamine or an alkoxyalkanolamine represented by the general formula $R^1R^2-NC_mH_{2m}OR^3$ wherein $R^1$ and $R^2$ are each a hydrogen atom, an alkyl group having 1 to 4 carbon atoms or a hydroxyethyl group; $R^3$ is a hydrogen atom, an alkyl group having 1 to 4 carbon atoms, a hydroxyethyl group, a methoxyethyl group or an ethoxyethyl group; and m is an integer of 2 to 4, (2) 1 to 30% by weight of a glycol monoalkyl ether represented by the general formula $R^4—(C_pH_{2p}O)_q—R^4$ wherein $R^4$ is a hydrogen atom or an alkyl group having 1 to 4 carbon atoms; p is an integer of 2 to 3; and q is an integer of 1 to 3, (3) 0.5 to 15% by weight of a sugar or a sugaralcohol, and water as the balance.

The second aspect of the present invention is directed to a removing agent composition for a photoresist which comprises (1) 5 to 45% by weight of an alkanolamine, an alkoxyalkylamine or an alkoxyalkanolamine represented by the general formula $R^1R^2—NC_mH_{2m}OR^3$ wherein $R^1$ and $R^2$ are each a hydrogen atom, an alkyl group having 1 to 4 carbon atoms or a hydroxyethyl group; $R^3$ is a hydrogen atom, an alkyl group having 1 to 4 carbon atoms, a hydroxyethyl group, a methoxyethyl group or an ethoxyethyl group; and m is an integer of 2 to 4, (2) 1 to 25% by weight of a glycol monoalkyl ether represented by the general formula $R^4—(C_pH_{2p}O)_q—R^4$ wherein $R^4$ is a hydrogen atom or an alkyl group having 1 to 4 carbon atoms; p is an integer of 2 to 3; and q is an integer of 1 to 3, (3) 0.5 to 15% by weight of a sugar or a sugaralcohol, (4) 0.01 to 10% by weight of a quaternary ammonium hydroxide represented by the general formula $[(R^5)_3N—R^6]^+OH^-$ wherein $R^5$ is an alkyl group having 1 to 4 carbon atoms, $R^6$ is an alkyl group or a hydroxyalkyl group having 1 to 4 carbon atoms, and water as the balance.

DETAILED DESCRIPTION OF THE INVENTION

Figure 1:
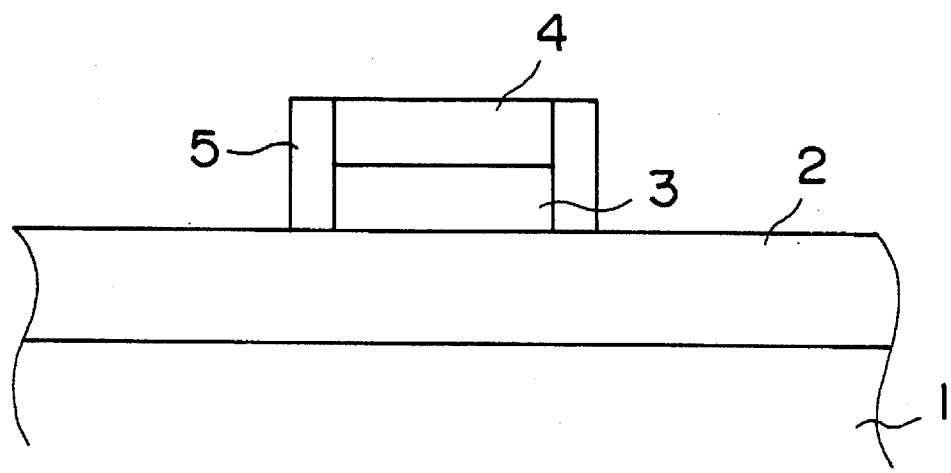
FIG. 1 shows a sectional view of a semiconductor device in which an aluminum wire 3 is formed by dry etching through a resist film 4 as a mask.

In the present invention, examples of alkanolamines, alkoxyalkylamines and alkoxyalkanolamines represented by the general formula $R^1R^2—NC_mH_{2m}OR^3$ include ethanolamine, N-methylethanolamine, N,N-dimethylethanolamine, N-ethylethanolamine, N,N-diethylethanolamine, propanolamine, N-methylpropanolamine, N,N-dimethylpropanolamine, N-ethylpropanolamine, N,N-diethylpropanolamine, 2-methoxyethylamine, 2-ethoxyethylamine, 3-methoxypropylamine, 3-ethoxypropylamine, 2-(2-aminoethoxy)ethanol, 2-(2-aminoethoxy)propanol, 2-amino-1-propanol and 1-amino-2-propanol.

Of the above-mentioned alkanolamines, alkoxyalkylamines and alkoxyalkanolamines, ethanolamine, N-methylethanolamine and 2-(2-aminoethoxy)ethanol can be suitably used.

The concentration of the alkanolamine, the alkoxyalkylamine or the alkoxyalkanolamine is in the range of 5 to 50% by weight, preferably 5 to 45% by weight, more preferably 10 to 40% by weight in the total solution. If the concentration of the alkanolamine, the alkoxyalkylamine or the alkoxyalkanolamine is less than the above-mentioned range, the removing speed of a photoresist is low, and if it is more than the above-mentioned range, the corrosion of a wiring material cannot be prevented any more.

Furthermore, examples of a glycol alkyl ether represented by the general formula $R^4—(C_pH_{2p}O)_q—R^4$ include ethylene glycol monomethyl ether, ethylene glycol monoethyl ether, ethylene glycol monobutyl ether, diethylene glycol monomethyl ether, diethylene glycol monoethyl ether, diethylene glycol monobutyl ether, diethylene glycol dimethyl ether, propylene glycol monomethyl ether, propylene glycol monoethyl ether, dipropylene glycol monomethyl ether, dipropylene glycol monomethyl ether and dipropylene glycol dimethyl ether.

The concentration of the glycol alkyl ether is in the range of 1 to 30% by weight, preferably 5 to 30% by weight, more preferably 5 to 20% by weight in the total solution. If the concentration of the glycol alkyl ether is less than the above-mentioned concentration range, the corrosion of the wiring material proceeds, and if it is more than the above-mentioned concentration range, the removing speed of the photoresist is low.

Examples of a sugar which can be used in the present invention include monosaccharides and polysaccharides, and typical examples of these sugars include glycerin aldehydes having 3 to 6 carbon atoms, threose, arabinose, xylose, ribose, ribulose, xylulose, glucose, mannose, galactose, tagatose, allose, altrose, gulose, idose, talose, sorbose, psicose and fruit sugar.

Examples of a sugaralcohol which can be used in the present invention include threitol, erythritol, adonitol, arabitol, xylitol, talitol, sorbitol, mannitol, iditol and dulcitol.

Of these sugars and sugaralcohols, glucose, mannose, galactose, sorbitol, mannitol and xylitol are preferable from the viewpoints of solubility, decomposability and the like.

The sugar or the sugaralcohol can be used in a concentration range of 0.1 to 15% by weight, preferably 1 to 10% by weight in the total solution. If the concentration of the sugar or the sugaralcohol is less than the above-mentioned concentration range, the corrosion of the wiring material cannot sufficiently be prevented, and conversely even if it is more than the above-mentioned concentration range, any further advantage cannot be obtained, which is not economical.

In the present invention, a quaternary ammonium hydroxide represented by the general formula $[(R^5)_3N—R^6]^+OH^-$ can be used, if necessary. Examples of the quaternary ammonium hydroxide include tetramethylammonium hydroxide, tetraethylammonium hydroxide, tetrapropylammonium hydroxide, tetrabutylammonium hydroxide, trimethylethylammonium hydroxide, dimethyldiethylammonium hydroxide, trimethyl(2-hydroxyethyl)ammonium hydroxide and triethyl(2-hydroxyethyl)ammonium hydroxide.

Of these quaternary ammonium hydroxides, tetramethylammonium hydroxide (TMAH) and trimethyl(2-hydroxyethyl)ammonium hydroxide are particularly preferable.

The concentration of the quaternary ammonium hydroxide to be used is preferably in the range of 0.01 to 10% by weight, more preferably 0.1 to 5% by weight in the total solution. When the concentration of the quaternary ammonium hydroxide is within this concentration range, the removing speed of the photoresist does not deteriorate conveniently.

Examples of an inorganic substrate, onto which the photoresist film is applied, include semiconductor wiring materials such as silicon, polysilicon, silicon oxide films, aluminum, aluminum alloys, titanium, titanium-tungsten, titanium nitride and tungsten, compound semiconductors such as gallium-arsenic, gallium-phosphorus and indium-phosphorus, and glass substrates of LCD.

The removing agent for the photoresist of the present invention can be used to remove a photoresist film applied onto an inorganic substrate, a remaining photoresist layer after the dry etching of the photoresist film applied onto the inorganic substrate, or a remaining photoresist residue after the dry etching and ashing, and in carrying out this removing operation, there can suitably be used heating, ultrasonic wave or the like together, if necessary.

A treatment method using the removing agent of the present invention is usually an immersion method, but another method such as a method utilizing spray may be used.

After the treatment using the removing agent of the present invention, a rinsing step can sufficiently be accomplished with water, and so an organic solvent such as an alcohol is not necessary.

When a removing agent composition for a photoresist according to the present invention is employed, a photoresist film applied onto an inorganic substrate, a remaining photoresist layer after the dry etching of the photoresist film applied onto the inorganic substrate, or a remaining photoresist residue after the dry etching and ashing can easily be removed at a low temperature in a short time, and at this time, an ultrafine work is possible without corroding any wiring material. In addition, a rinsing step can be carried out with water alone, and so an organic solvent such as an alcohol does not have to be used, whereby highly accurately wired patterns can be manufactured.

Next, the present invention will be described in more detail with reference to examples and comparative examples. However, the scope of the present invention should not be limited to these examples at all.

Examples 1 to 9, Comparative Examples 1 to 4

FIG. 1 shows a sectional view of a semiconductor device in which an aluminum wire 3 is formed by dry etching through a resist film 4 as a mask. In FIG. 1, a semiconductor device substrate 1 is covered with an oxide film 2, and by the dry etching, a side wall protective film 5 is formed.

The semiconductor device in FIG. 1 was immersed in each of removing agents having compositions shown in Table 1 for a predetermined time, and then rinsed with superpure water, followed by drying. Next, observation was made through an electron microscope (SEM). The removing properties of a resist film 4 and a residual 5 and the corrosive properties of the aluminum (Al) wire 3 were evaluated, and the results are shown in Table 1.

The evaluation of the removing properties and the corrosive properties by the SEM observation was made on the basis of the following ranking.

Removing properties:
⊚: The resist film or the residual was completely removed.
Δ: The resist film or the residual was partially observed.
X: Most of the resist film or the residual remained.
Corrosive properties:
⊚: Any corrosion was not observed.
Δ: The corrosion was partially observed.
X: The noticeable corrosion was observed.

Examples 10 to 18, Comparative Examples 5 to 8

The same procedures as in Examples 1 to 9 and Comparative examples 1 to 4 were repeated except that the removing agents having compositions shown in Table 1 were replaced with the removing agents having compositions shown in Table 2, and removing properties and corrosive properties were then evaluated. The results are shown in Table 2.

Examples 19 to 24, Comparative Examples 9 to 12

Figure 2:
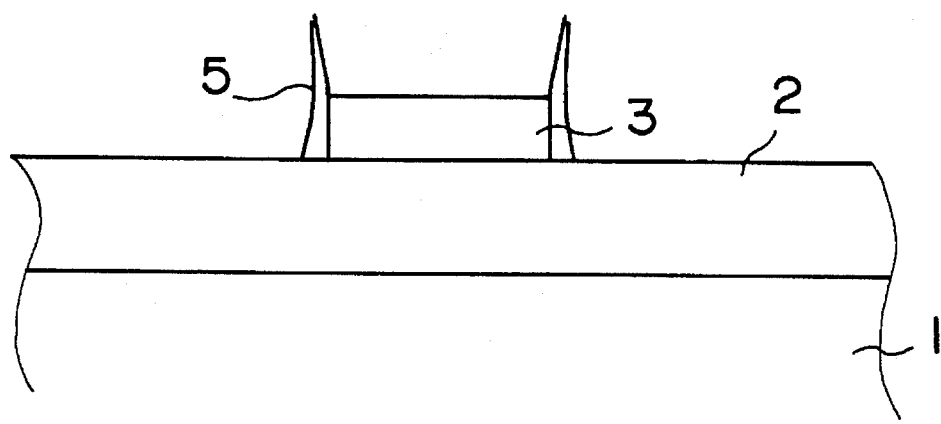
FIG. 2 shows a sectional view of a semiconductor device in which the resist film 4 has been removed by resist ashing the semiconductor device in FIG. 1 with an oxygen plasma.

FIG. 2 shows a sectional view of a semiconductor device in which a resist film 4 in FIG. 1 has been removed by resist ashing a semiconductor device used in Example 1 with an oxygen plasma. In FIG. 2, a residual (a side wall protective deposition film) 5 was not removed by the oxygen plasma, and the upper portion of the residual 5 was only deformed so as to spread around an aluminum wire 3.

After the resist ashing, the semiconductor device in FIG. 2 was immersed in each of removing agents having compositions shown in Table 3 for a predetermined time, and then rinsed with superpure water, followed by drying. Next, the corrosive properties of the aluminum wire 3 were then evaluated by an electron microscope (SEM), and the results are shown in Table 3.

Examples 25 to 33, Comparative Example 13 to 16

The same procedures as in Examples 19 to 24 and Comparative examples 9 to 12 were repeated except that the removing agents having compositions shown in Table 3 were replaced with the removing agents having compositions shown in Table 4, and removing properties and corrosive properties were then evaluated. The results are shown in Table 4.

TABLE 1 (I)

| | Amine Component | | Ether Component | | Sugaralcohol Component | | $H_2O$ |
|---|---|---|---|---|---|---|---|
| | Kind | wt % | Kind | wt % | Kind | wt % | wt % |
| Example 1 | Monoethanolamine | 40 | Diethylene glycol monomethyl ether | 20 | Sorbitol | 5 | 35 |
| Example 2 | N-methylethanolamine | 40 | Diethylene glycol monomethyl ether | 20 | Sorbitol | 5 | 35 |
| Example 3 | 2-(2-aminoethoxy)-ethanol | 40 | Diethylene glycol monomethyl ether | 20 | Sorbitol | 5 | 35 |

TABLE 1 (I)-continued

| | Amine Component | | Ether Component | | Sugaralcohol Component | | H₂O |
|---|---|---|---|---|---|---|---|
| | Kind | wt % | Kind | wt % | Kind | wt % | wt % |
| Example 4 | Monoethanolamine | 40 | Dipropylene glycol monomethyl ether | 20 | Sorbitol | 5 | 35 |
| Example 5 | Monoethanolamine | 40 | Diethylene glycol monomethyl ether | 20 | Xylitol | 5 | 35 |
| Example 6 | Monoethanolamine | 50 | Diethylene glycol monomethyl ether | 10 | Sorbitol | 5 | 35 |

TABLE 1 (II)

| | Amine Component | | Ether Component | | Sugaralcohol Component | | H₂O |
|---|---|---|---|---|---|---|---|
| | Kind | wt % | Kind | wt % | Kind | wt % | wt % |
| Example 7 | Monoethanolamine | 50 | Diethylene glycol monoethyl ether | 15 | Sorbitol | 10 | 25 |
| Example 8 | Monoethanolamine | 30 | Diethylene glycol monomethyl ether | 20 | Sorbitol | 10 | 40 |
| Example 9 | Monoethanolamine | 40 | Diethylene glycol monomethyl ether | 10 | Sorbitol | 15 | 25 |
| Comp. Ex. 1 | Monoethanolamine | 50 | | | | | 50 |
| Comp. Ex. 2 | Monoethanolamine | 40 | Diethylene glycol monomethyl ether | 20 | | | 40 |
| Comp. Ex. 3 | | | Diethylene glycol monomethyl ether | 40 | Sorbitol | 5 | 55 |
| Comp. Ex. 4 | | | | | Sorbitol | 10 | 90 |

TABLE 1 (III)

| | Immersion Conditions | | Removing Properties | | Corrosive |
|---|---|---|---|---|---|
| | Temp. (°C.) | Time (min) | Resist Film 4 | Residue 5 | Properties Al Wire 3 |
| Example 1 | 50 | 10 | ⊙ | ⊙ | ⊙ |
| Example 2 | 50 | 10 | ⊙ | ⊙ | ⊙ |
| Example 3 | 50 | 10 | ⊙ | ⊙ | ⊙ |
| Example 4 | 60 | 10 | ⊙ | ⊙ | ⊙ |
| Example 5 | 50 | 10 | ⊙ | ⊙ | ⊙ |
| Example 6 | 50 | 10 | ⊙ | ⊙ | ⊙ |
| Example 7 | 50 | 10 | ⊙ | ⊙ | ⊙ |
| Example 8 | 50 | 15 | ⊙ | ⊙ | ⊙ |
| Example 9 | 70 | 3 | ⊙ | ⊙ | ⊙ |
| Comp. Ex. 1 | 50 | 10 | ⊙ | Δ | X |
| Comp. Ex. 2 | 50 | 10 | ⊙ | Δ | X |
| Comp. Ex. 3 | 50 | 10 | X | X | ⊙ |
| Comp. Ex. 4 | 50 | 10 | X | X | ⊙ |

TABLE 2 (I)

| | Amine Component | | Ether Component | | Sugaralcohol Component | |
|---|---|---|---|---|---|---|
| | Kind | wt % | Kind | wt % | Kind | wt % |
| Example 10 | Monoethanolamine | 35 | Diethylene glycol monomethyl ether | 20 | Sorbitol | 10 |
| Example 11 | N-methyl-ethanol-amine | 35 | Diethylene glycol monomethyl ether | 20 | Sorbitol | 10 |
| Example 12 | 2-(2-aminoethoxy)eth- | 35 | Diethylene glycol mono- | 20 | Sorbitol | 10 |

TABLE 2 (I)-continued

| | Amine Component | | Ether Component | | Sugaralcohol Component | |
|---|---|---|---|---|---|---|
| | Kind | wt % | Kind | wt % | Kind | wt % |
| Example 13 | Monoethanolamine | 35 | Dipropylene glycol monomethyl ether | 20 | Sorbitol | 10 |
| Example 14 | Monoethanolamine | 35 | Diethylene glycol monomethyl ether | 20 | Sorbitol | 10 |
| Example 15 | Monoethanolamine | 45 | Diethylene glycol monomethyl ether | 10 | Sorbitol | 10 |

TABLE 2 (II)

| | Amine Component | | Ether Component | | Sugaralcohol Component | |
|---|---|---|---|---|---|---|
| | Kind | wt % | Kind | wt % | Kind | wt % |
| Example 16 | Monoethanolamine | 45 | Diethylene glycol monomethyl ether | 15 | Sorbitol | 10 |
| Example 17 | Monoethanolamine | 25 | Diethylene glycol monomethyl ether | 20 | Sorbitol | 10 |
| Example 18 | Monoethanolamine | 35 | Diethylene glycol monomethyl ether | 20 | Sorbitol | 5 |
| Comp. Ex. 5 | Monoethanolamine | 50 | | | | |
| Comp. Ex. 6 | Monoethanolamine | 50 | Diethylene glycol monomethyl ether | 20 | | |
| Comp. Ex. 7 | | | Diethylene glycol monomethyl ether | 40 | Sorbitol | 10 |
| Comp. Ex. 8 | Monoethanolamine | 35 | Diethylene glycol monomethyl ether | 20 | Sorbitol | 10 |

TABLE 2 (III)

| | Quaternary Ammonium Hydroxide Component | | Water |
|---|---|---|---|
| | Kind | wt % | wt % |
| Example 10 | Tetramethylammonium hydroxide | 3 | 32 |
| Example 11 | Tetramethylammonium hydroxide | 3 | 32 |
| Example 12 | Tetramethylammonium hydroxide | 3 | 32 |
| Example 13 | Tetramethylammonium hydroxide | 3 | 32 |
| Example 14 | Trimethyl(2-hydroxyethyl)ammonium hydroxide | 3 | 32 |
| Example 15 | Tetramethylammonium hydroxide | 0.5 | 34.5 |
| Example 16 | Tetramethylammonium hydroxide | 0.5 | 29.5 |
| Example 17 | Tetramethylammonium hydroxide | 5 | 40 |
| Example 18 | Tetramethylammonium hydroxide | 1 | 40 |
| Comp. Ex. 5 | Tetramethylammonium hydroxide | 3 | 47 |
| Comp. Ex. 6 | Tetramethylammonium hydroxide | 3 | 27 |
| Comp. Ex. 7 | Tetramethylammonium hydroxide | 3 | 47 |
| Comp. Ex. 8 | | | 35 |

TABLE 2 (IV)

| | Immersion Conditions | | Removing Properties | | Corrosive |
|---|---|---|---|---|---|
| | Temp. (°C.) | Time (min) | Resist Film 4 | Residue 5 | Properties Al Wire 3 |
| Example 10 | 50 | 5 | ◉ | ◉ | ◉ |
| Example 11 | 50 | 5 | ◉ | ◉ | ◉ |
| Example 12 | 50 | 5 | ◉ | ◉ | ◉ |
| Example 13 | 50 | 5 | ◉ | ◉ | ◉ |
| Example 14 | 50 | 5 | ◉ | ◉ | ◉ |
| Example 15 | 50 | 5 | ◉ | ◉ | ◉ |
| Example 16 | 50 | 5 | ◉ | ◉ | ◉ |
| Example 17 | 50 | 10 | ◉ | ◉ | ◉ |
| Example 18 | 70 | 1 | ◉ | ◉ | ◉ |

TABLE 2 (IV)-continued

|  | Immersion Conditions | | Removing Properties | | Corrosive Properties |
|---|---|---|---|---|---|
|  | Temp. (°C.) | Time (min) | Resist Film 4 | Residue 5 | Al Wire 3 |
| Comp. Ex. 5 | 50 | 5 | ◉ | Δ | X |
| Comp. Ex. 6 | 50 | 5 | ◉ | ◉ | X |
| Comp. Ex. 7 | 50 | 10 | X | X | ◉ |
| Comp. Ex. 8 | 50 | 5 | Δ | Δ | ◉ |

TABLE 3 (III)-continued

|  | Immersion Conditions | | Removing Properties | Corrosive Properties |
|---|---|---|---|---|
|  | Temp. (°C.) | Time (min.) | Residue 5 | Al Wire 3 |
| Comp. Ex. 11 | 50 | 10 | X | ◉ |
| Comp. Ex. 12 | 50 | 10 | X | ◉ |

TABLE 3 (I)

|  | Amine Component | | Ether Component | | Sugaralcohol Component | | H₂O |
|---|---|---|---|---|---|---|---|
|  | Kind | wt % | Kind | wt % | Kind | wt % | wt % |
| Example 19 | Monoethanolamine | 40 | Diethylene glycol monomethyl ether | 20 | Sorbitol | 5 | 35 |
| Example 20 | N-methylethanolamine | 40 | Diethylene glycol monomethyl ether | 20 | Sorbitol | 5 | 35 |
| Example 21 | 2-(2-aminoethoxy)-ethanol | 40 | Diethylene glycol monomethyl ether | 20 | Sorbitol | 5 | 35 |
| Example 22 | Monoethanolamine | 40 | Dipropylene glycol monomethyl ether | 20 | Sorbitol | 5 | 35 |
| Example 23 | Monoethanolamine | 40 | Diethylene glycol monomethyl ether | 20 | Xylitol | 5 | 35 |
| Example 24 | Monoethanolamine | 50 | Diethylene glycol monomethyl ether | 10 | Sorbitol | 5 | 35 |

TABLE 3 (II)

|  | Amine Component | | Ether Component | | Sugaralcohol Component | | H₂O |
|---|---|---|---|---|---|---|---|
|  | Kind | wt % | Kind | wt % | Kind | wt % | wt % |
| Example 9 | Monoethanolamine | 50 |  |  |  |  | 55 |
| Comp. Ex. 10 | Monoethanolamine | 40 | Diethylene glycol monomethyl ether | 20 |  |  | 40 |
| Comp. Ex. 11 |  |  | Diethylene glycol monomethyl ether | 40 | Sorbitol | 5 | 55 |
| Comp. Ex. 12 |  |  |  |  | Sorbitol | 10 | 90 |

TABLE 3 (III)

|  | Immersion Conditions | | Removing Properties | Corrosive Properties |
|---|---|---|---|---|
|  | Temp. (°C.) | Time (min.) | Residue 5 | Al Wire 3 |
| Example 19 | 50 | 10 | ◉ | ◉ |
| Example 20 | 50 | 10 | ◉ | ◉ |
| Example 21 | 50 | 10 | ◉ | ◉ |
| Example 22 | 50 | 10 | ◉ | ◉ |
| Example 23 | 50 | 10 | ◉ | ◉ |
| Example 24 | 50 | 10 | ◉ | ◉ |
| Comp. Ex. 9 | 50 | 10 | Δ | X |
| Comp. Ex. 10 | 50 | 10 | Δ | X |

TABLE 4 (I)

| | Amine Component | | Ether Component | | Sugaralcohol Component | |
|---|---|---|---|---|---|---|
| | Kind | wt % | Kind | wt % | Kind | wt % |
| Example 25 | Monoethanolamine | 35 | Diethylene glycol monomethyl ether | 20 | Sorbitol | 10 |
| Example 26 | N-methylethanolamine | 35 | Diethylene glycol monomethyl ether | 20 | Sorbitol | 10 |
| Example 27 | 2-(2-aminoethoxy)ethanolamine | 35 | Diethylene glycol monomethyl ether | 20 | Sorbitol | 10 |
| Example 28 | Monoethanolamine | 35 | Dipropylene glycol monomethyl ether | 20 | Sorbitol | 10 |
| Example 29 | Monoethanolamine | 35 | Diethylene glycol monomethyl ether | 20 | Sorbitol | 10 |
| Example 30 | Monoethanolamine | 45 | Diethylene glycol monomethyl ether | 10 | Sorbitol | 10 |

TABLE 4 (II)

| | Amine Component | | Ether Component | | Sugaralcohol Component | |
|---|---|---|---|---|---|---|
| | Kind | wt % | Kind | wt % | Kind | wt % |
| Example 31 | Monoethanolamine | 45 | Diethylene glycol monomethyl ether | 15 | Sorbitol | 10 |
| Example 32 | Monoethanolamine | 25 | Diethylene glycol monomethyl ether | 20 | Sorbitol | 10 |
| Example 33 | Monoethanolamine | 35 | Diethylene glycol monomethyl ether | 20 | Sorbitol | 5 |
| Comp. Ex. 13 | Monoethanolamine | 50 | | | | |
| Comp. Ex. 14 | Monoethanolamine | 50 | Diethylene glycol monomethyl ether | 20 | | |
| Comp. Ex. 15 | | | Diethylene glycol monomethyl ether | 40 | Sorbitol | 10 |
| Comp. Ex. 16 | Monoethanolamine | 35 | Diethylene glycol monomethyl ether | 20 | Sorbitol | 10 |

TABLE 4 (III)

| | Quaternary Ammonium Hydroxide Component | | Water |
|---|---|---|---|
| | Kind | wt % | wt % |
| Example 25 | Tetramethylammonium hydroxide | 3 | 32 |
| Example 26 | Tetramethylammonium hydroxide | 3 | 32 |
| Example 27 | Tetramethylammonium hydroxide | 3 | 32 |
| Example 28 | Tetramethylammonium hydroxide | 3 | 32 |
| Example 29 | Trimethyl(2-hydroxyethyl)ammonium hydroxide | 3 | 32 |
| Example 30 | Tetramethylammonium hydroxide | 0.5 | 34.5 |
| Example 31 | Tetramethylammonium hydroxide | 0.5 | 29.5 |
| Example 32 | Tetramethylammonium hydroxide | 5 | 40 |
| Example 33 | Tetramethylammonium hydroxide | 1 | 40 |
| Comp. Ex. 13 | Tetramethylammonium hydroxide | 3 | 47 |
| Comp. Ex. 14 | Tetramethylammonium hydroxide | 3 | 27 |
| Comp. Ex. 15 | Tetramethylammonium hydroxide | 3 | 47 |
| Comp. Ex. 16 | | | 35 |

TABLE 4 (IV)

|  | Immersion Conditions | | Removing Properties | Corrosive Properties |
|---|---|---|---|---|
|  | Temp. (°C.) | Time (min.) | Residue 5 | Al Wire 3 |
| Example 25 | 50 | 5 | ◎ | ◎ |
| Example 26 | 50 | 5 | ◎ | ◎ |
| Example 27 | 50 | 5 | ◎ | ◎ |
| Example 28 | 50 | 5 | ◎ | ◎ |
| Example 29 | 50 | 5 | ◎ | ◎ |
| Example 30 | 50 | 5 | ◎ | ◎ |
| Example 31 | 50 | 5 | ◎ | ◎ |
| Example 32 | 50 | 10 | ◎ | ◎ |
| Example 33 | 70 | 1 | ◎ | ◎ |
| Comp. Ex. 13 | 50 | 5 | Δ | X |
| Comp. Ex. 14 | 50 | 5 | ◎ | X |
| Comp. Ex. 15 | 50 | 10 | X | ◎ |
| Comp. Ex. 16 | 50 | 5 | Δ | ◎ |

What is claimed is:

1. A removing agent composition for a photoresist which comprises
   (1) 5 to 50% by weight of an alkanolamine, an alkoxyalkylamine or an alkoxyalkanolamine represented by the general formula $R^1R^2$—$NC_mH_{2m}OR^3$ wherein $R^1$ and $R^2$ are each a hydrogen atom, an alkyl group having 1 to 4 carbon atoms or a hydroxyethyl group; $R^3$ is a hydrogen atom, an alkyl group having 1 to 4 carbon atoms, a hydroxyethyl group, a methoxyethyl group or an ethoxyethyl group; and m is an integer of 2 to 4,
   (2) 1 to 30% by weight of a glycol monoalkyl ether represented by the general formula $R^4$—$(C_pH_{2p}O)_q$—$R^4$ wherein $R^4$ is a hydrogen atom or an alkyl group having 1 to 4 carbon atoms; p is an integer of 2 to 3; and q is an integer of 1 to 3,
   (3) 0.5 to 15% by weight of a sugar or a sugaralcohol, and water as the balance.

2. A method for releasing a photoresist which comprises the step of releasing the photoresist by the use of a removing agent composition for a photoresist described in claim 1.

3. The method for releasing a photoresist according to claim 2 wherein a photoresist film applied onto an inorganic substrate is removed.

4. The method for releasing a photoresist according to claim 2 wherein a mask is formed from a photoresist film on an inorganic substrate, the unmasked portions of the substrate are dry etched, and the photoresist layer formed into the mask is then removed.

5. The method for releasing a photoresist according to claim 2 wherein a mask is formed from a photoresist film on an inorganic substrate, the unmasked portions of the substrate are dry etched, the photoresist layer formed into the mask is further ashed, and a remaining photoresist residue is then removed.

6. A removing agent composition for a photoresist which comprises
   (1) 5 to 45% by weight of an alkanolamine, an alkoxyalkylamine or an alkoxyalkanolamine represented by the general formula $R^1R^2$—$NC_mH_{2m}OR^3$ wherein $R^1$ and $R^2$ are each a hydrogen atom, an alkyl group having 1 to 4 carbon atoms or a hydroxyethyl group; $R^3$ is a hydrogen atom, an alkyl group having 1 to 4 carbon atoms, a hydroxyethyl group, a methoxyethyl group or an ethoxyethyl group; and m is an integer of 2 to 4,
   (2) 1 to 25% by weight of a glycol monoalkyl ether represented by the general formula $R^4$—$(C_pH_{2p}O)_q$—$R^4$ wherein $R^4$ is a hydrogen atom or an alkyl group having 1 to 4 carbon atoms; p is an integer of 2 to 3; and q is an integer of 1 to 3,
   (3) 0.5 to 15% by weight of a sugar or a sugaralcohol,
   (4) 0.01 to 10% by weight of a quaternary ammonium hydroxide represented by the general formula $[(R^5)_3N$—$R^6]^+OH^-$ wherein $R^5$ is an alkyl group having 1 to 4 carbon atoms, $R^6$ is an alkyl group or a hydroxyalkyl group having 1 to 4 carbon atoms, and water as the balance.

7. A method for releasing a photoresist which comprises the step of releasing the photoresist by the use of a removing agent composition for a photoresist described in claim 6.

8. The method for releasing a photoresist according to claim 7 wherein a photoresist film applied onto an inorganic substrate is removed.

9. The method for releasing a photoresist according to claim 7 wherein a mask is formed from a photoresist film on an inorganic substrate, the unmasked portions of the substrate are dry etched, and the photoresist layer formed into the mask is then removed.

10. The method for releasing a photoresist according to claim 7 wherein a mask is formed from a photoresist film on an inorganic substrate, the unmasked portions of the substrate are dry etched, the photoresist layer formed into the mask is further ashed, and a remaining photoresist residue is then removed.

* * * * *